(12) United States Patent
Fujikawa

(10) Patent No.: US 11,643,749 B2
(45) Date of Patent: May 9, 2023

(54) CRUCIBLE AND SIC SINGLE CRYSTAL GROWTH APPARATUS

(71) Applicant: SHOWA DENKO K.K., Tokyo (JP)

(72) Inventor: Yohei Fujikawa, Hikone (JP)

(73) Assignee: SHOWA DENKO K.K., Tokyo (JP)

(*) Notice: Subject to any disclaimer, the term of this patent is extended or adjusted under 35 U.S.C. 154(b) by 378 days.

(21) Appl. No.: 16/391,556

(22) Filed: Apr. 23, 2019

(65) Prior Publication Data
US 2019/0330764 A1 Oct. 31, 2019

(30) Foreign Application Priority Data
Apr. 26, 2018 (JP) .............................. JP2018-085805

(51) Int. Cl.
| | |
|---|---|
| *C23C 14/24* | (2006.01) |
| *C23C 14/06* | (2006.01) |
| *C30B 23/06* | (2006.01) |
| *C30B 29/36* | (2006.01) |

(52) U.S. Cl.
CPC ........ *C30B 23/066* (2013.01); *C23C 14/0635* (2013.01); *C23C 14/243* (2013.01); *C30B 29/36* (2013.01)

(58) Field of Classification Search
CPC ................................................. C23C 14/243
See application file for complete search history.

(56) References Cited

U.S. PATENT DOCUMENTS

| | | | | |
|---|---|---|---|---|
| 2004/0035366 A1* | 2/2004 | Keum | ..................... | C23C 14/24 118/726 |
| 2004/0200359 A1* | 10/2004 | Snider | ................. | A47J 37/0704 99/446 |
| 2009/0250007 A1* | 10/2009 | Kim | ....................... | C23C 14/243 118/726 |
| 2013/0163967 A1* | 6/2013 | Lukin | ................... | C23C 14/228 392/389 |
| 2016/0298227 A1* | 10/2016 | Zhang | ................... | C23C 14/243 |
| 2018/0105924 A1* | 4/2018 | Liu | ........................ | C23C 14/243 |
| 2019/0119807 A1* | 4/2019 | Bastian | ................. | C23C 14/243 |

FOREIGN PATENT DOCUMENTS

| | | |
|---|---|---|
| CN | 202786404 U | 3/2013 |
| CN | 105648404 A | 6/2016 |
| CN | 205474112 U | 8/2016 |
| CN | 206418222 U | 8/2017 |
| JP | 05-058774 A | 3/1993 |
| JP | 11-268990 A | 10/1999 |
| JP | 2007-231370 A | 9/2007 |
| JP | 2010-076991 A | 4/2010 |

(Continued)

OTHER PUBLICATIONS

JP2007-231370 Iwasaki Sep. 2007 Eng mach trans (Year: 2007).*

(Continued)

*Primary Examiner* — Joseph A Miller, Jr.
(74) *Attorney, Agent, or Firm* — Sughrue Mion, PLLC

(57) ABSTRACT

The present invention provides a crucible and a SiC single crystal growth apparatus capable of improving the efficiency of using source materials. The crucible includes a lid and a container. The container includes a bottom facing the lid. The bottom includes a recess which is recessed towards the lid.

8 Claims, 5 Drawing Sheets

(56) References Cited

FOREIGN PATENT DOCUMENTS

WO    WO2017/114364    *    7/2017

OTHER PUBLICATIONS

Office Action dated Oct. 13, 2020 from the China National Intellectual Property Administration in CN Application No. 201910293752.4.
Bo'yun Huang, "The Third-Generation Semiconductor Materials", China Railway Publishing House, Jan. 31, 2017, Paragraphs 2-3, p. 118 ( 5 pages total).
Communication dated Jun. 23, 2021, from the China National Intellectual Property Administration in application No. 201910293752.4.
Communication dated Nov. 2, 2021 from the Japanese Patent Office in Application No. 2018-085805.
Notice of Allowance dated Jan. 4, 2022 from the Japanese Patent Office in JP Application No. 2018-085805.

* cited by examiner

CRUCIBLE AND SIC SINGLE CRYSTAL GROWTH APPARATUS

TECHNICAL FIELD

The present invention relates to a crucible and a SiC single crystal growth apparatus.

This application claims the benefit of priority from Japanese Patent Application No. 2018-085805 filed in Japan on Apr. 26, 2018, the contents of which are incorporated herein by reference.

BACKGROUND ART

Silicon carbide (SiC) has characteristic properties. For example, compared with silicon (Si), the dielectric breakdown electric field is one order of magnitude larger, the band gap is three times larger, and the thermal conductivity is about three times higher. Therefore, silicon carbide (SiC) is expected to be applied to power devices, high frequency devices, high temperature operation devices and the like.

With the development of recent technologies, there is a need for lowering the price of SiC devices using SiC. The SiC devices are fabricated by processing SiC epitaxial wafers. Therefore, a large diameter of the SiC epitaxial wafer and a large-diameter single crystal SiC for acquiring the SiC epitaxial wafer are required.

As one of methods for manufacturing a SiC single crystal, a sublimation method is widely known. The sublimation method is a method of growing a seed crystal into a larger SiC single crystal. The seed crystal made of a SiC single crystal is placed on a pedestal placed in a graphite crucible and the crucible is heated. A sublimation gas obtained by subliming a source material powder in the crucible is supplied to the seed crystal, and the seed crystal is grown to the larger SiC single crystal.

For example, Patent Document 1 discloses that a rod-shaped graphite is provided inside a crucible in order to obtain a large-diameter SiC single crystal. Patent Document 1 discloses that the growth rates of a single crystal at a central portion and an outer peripheral portion are stabilized by heating the rod-shaped graphite by thermal conduction or thermal radiation.

[Patent Document 1] Japanese Unexamined Patent Publication, First Publication No. 1993-58774

SUMMARY OF THE INVENTION

However, the rod-like graphite in the Patent Document 1 cannot sufficiently heat the source material provided in the center of the crucible. Patent Document 1 discloses the rod-shaped graphite provided in the center of the crucible is heated by thermal conduction. However, since the heat conduction is caused by a temperature difference, it is impossible to sufficient limit the temperature difference between the outer peripheral portion and the central portion of the crucible.

On the other hand, the rod-like graphite may be heated by induction heating. However, a high frequency by a coil is absorbed by the outer periphery of the crucible. Therefore, it is impossible to sufficiently heat the rod-shaped graphite provided inside the crucible by the high frequency.

The present invention has been made in view of the above problems, and an object thereof is to provide a crucible and a SiC single crystal growth apparatus capable of increasing the use efficiency of source materials.

The present inventors have found that it is possible to efficiently sublime the source material placed in the center of the crucible, by providing a recess in the crucible and providing an inner heating device in the recess.

That is, the present invention provides the following means in order to solve the above problems.

(1) A crucible, including: a lid and a container, wherein the container comprises a bottom which faces the lid, and the bottom includes a recess which is recessed towards the lid.

(2) The crucible according to (1), wherein the recess is located in a center of the bottom in plan view, and a shape of the recess is circular in plan view.

(3) The crucible according to (1), wherein the recess is in a concentric position from a center of the bottom in plan view, and a shape of the recess is annular in plan view.

(4) A SiC single crystal growth apparatus, including: the crucible according to any one of the (1) to (3), an inner heating device provided in the recess of the crucible, and an outer heating device provided outside the crucible.

(5) The SiC single crystal growth apparatus according to (4), further including: a moving mechanism for moving the inner heating device in a height direction of the crucible.

(6) The SiC single crystal growth apparatus according to (4) or (5), wherein the inner heating device uses a resistance heating method.

The crucible and the SiC single crystal growth apparatus according to one embodiment of the present invention can increase the use efficiency of source materials.

DETAILED DESCRIPTION OF THE INVENTION

Hereinafter, the present embodiment will be described in detail with reference to the drawings as appropriate. In order to make the features of the present invention easy to understand, the drawings used in the following description may show enlarged features for convenience, and the dimensional ratio of each component may be different from the actual one. Materials, dimensions, and the like exemplified in the following description are merely examples, and the present invention is not limited to them, and can be appropriately changed and implemented without changing the gist of the invention.

SiC Single Crystal Growth Apparatus

Figure 1:
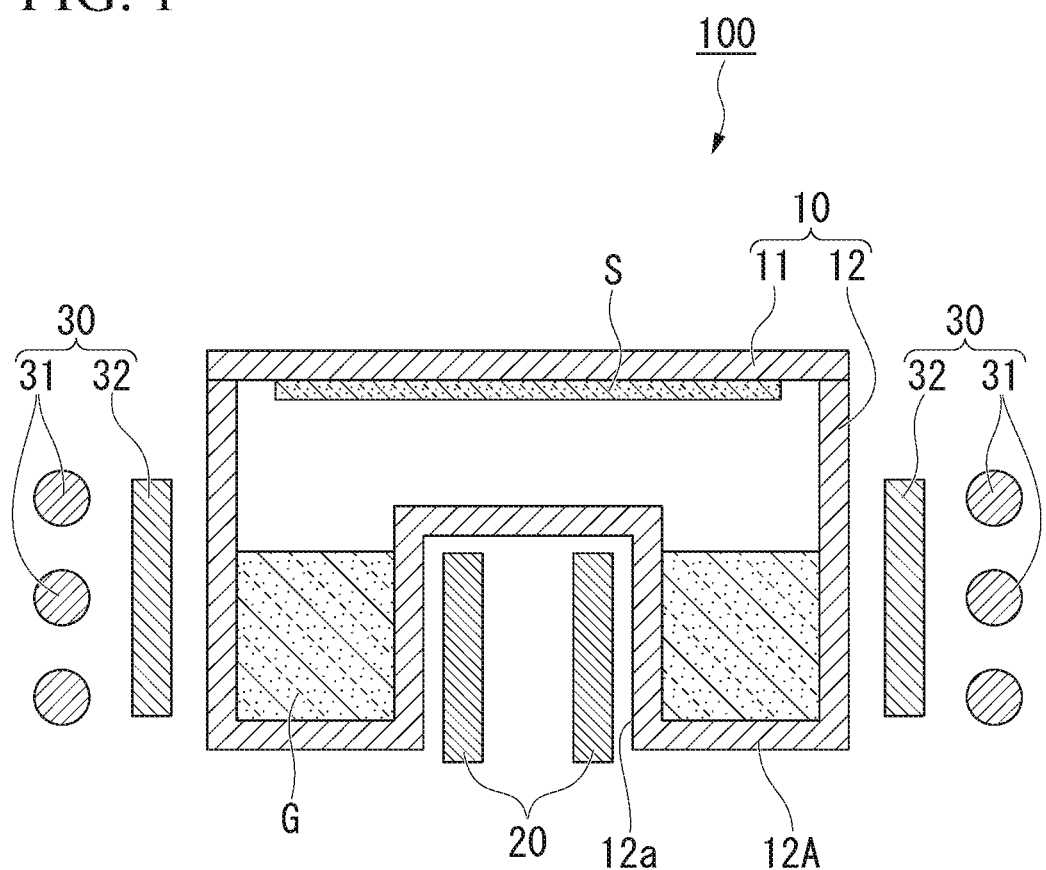
FIG. 1 is a schematic cross-sectional view of the SiC single crystal growth apparatus according to the present embodiment.

FIG. 1 is a schematic cross-sectional view of a SiC single crystal growth apparatus according to this embodiment. The SiC single crystal growth apparatus 100 shown in FIG. 1 includes a crucible 10, an inner heating device 20 and an outer heating device 30. In FIG. 1, in order to facilitate understanding, a seed crystal S and a source material G are shown at the same time.

Crucible

The crucible 10 is a crucible for crystal growth of a single crystal by a sublimation method. The crucible 10 includes a lid 11 and a container 12. The seed crystal may be provided at the lid 11, and the container 12 may hold the source material G. When the source material G is placed in the container 12 and the seed crystal S is placed at the lid 11, the seed crystal S is disposed opposite to the source material G. The source material gas obtained by subliming the source material G is recrystallized on the seed crystal S, and the single crystal grows.

A recess 12a is formed on the bottom 12A facing the lid 11 of the container 12 of the crucible 10. The recess 12a is recessed toward the lid 11 when viewed from the outside of the crucible 10. The recess 12a accommodates the inner heating device 20 as shown in FIG. 1.

It is preferred that the recess 12a is positioned symmetrically with respect to the center of the crucible 10 in plan view. The crucible 10 can be uniformly heated by the inner heating device 20 installed in the recess 12a. By uniformly heating the crucible 10, the source material G can be efficiently sublimed.

Figure 2:
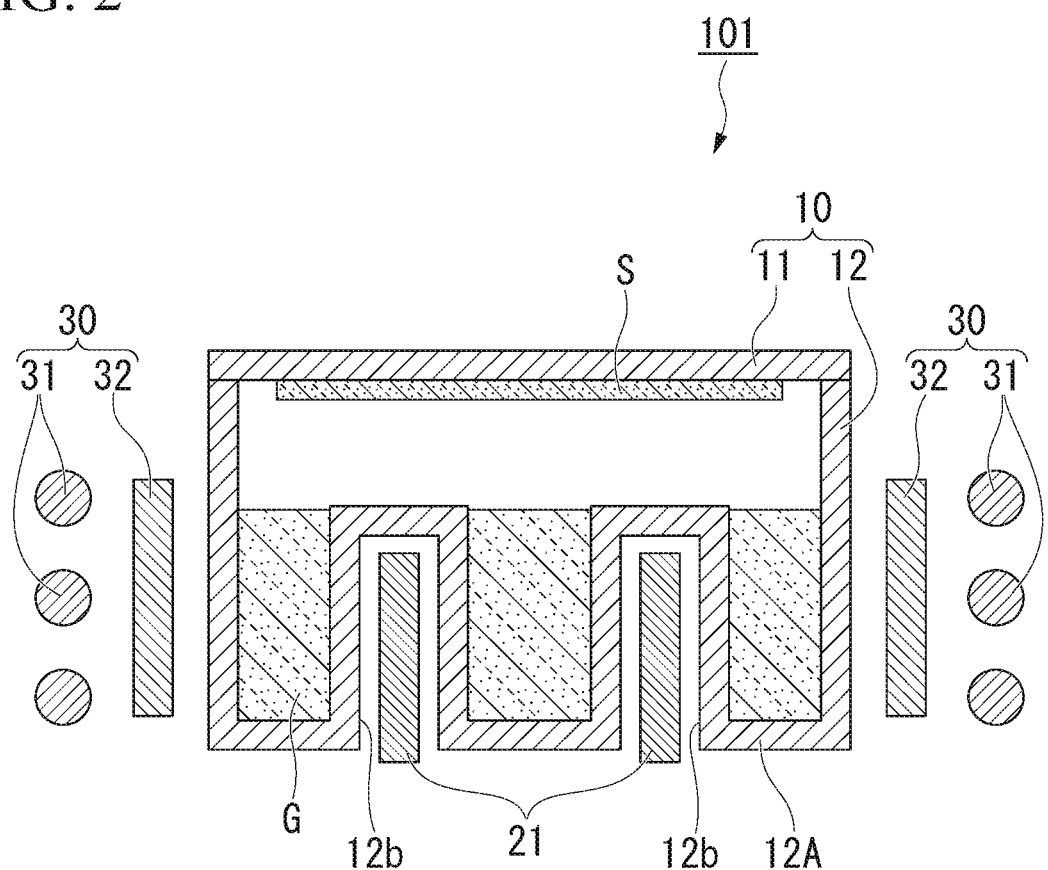
FIG. 2 is a schematic cross-sectional view of another example of the SiC single crystal growth apparatus according to the present embodiment.

As a specific example in the case where the recess 12a is symmetrical with respect to the center of the crucible in the plan view, the following examples can be given. The first example is a structure in which the recess 12a is provided at the center in plan view of the crucible 10, and the shape of the recess 12a is circular in plan view. FIG. 1 corresponds to the first example. Moreover, the second example is a structure in which the recess 12a is provided concentrically from a center of the crucible 10 in plan view, and the shape of the recess 12a is annular in plan view. FIG. 2 is a schematic cross-sectional view of another example of the SiC single crystal growth apparatus according to the present embodiment, and corresponds to the second example. The SiC single crystal growth apparatus 101 shown in FIG. 2 includes a recess 12b which is annular in plan view, and an inner heating device 21 is accommodated in the recess 12b. In addition, a configuration in which columnar recesses are dispersed at concentric positions from the center of the crucible 10 in plan view may be used.

Inner Heating Device

The inner heating device 20 is accommodated in the recess 12a of the crucible 10. The inner heating device 20 heats the source material G from the inside of the crucible 10.

As the inner heating device 20, a known heating method can be used. For example, a resistance heating method, an induction heating method, or the like can be used as the heating method. The inner heating device preferably uses the resistance heating method. When the inner heating device 20 uses the resistance heating, it is only necessary to connect the inner heating device 20 to an external current source. That is, it is possible to prevent the configuration of the SiC single crystal growth apparatus 100 from becoming complicated.

When the inner heating device 20 uses the induction heating method, the inner heating device 20 needs to have a high frequency generating source such as a coil. When growing a SiC single crystal, a high frequency generation source is covered with a heat insulating material or the like. By covering the high-frequency generation source with a heat insulating material, it is possible to prevent melting of the high-frequency generation source even under a high temperature environment where the SiC single crystal is grown.

Figure 3:
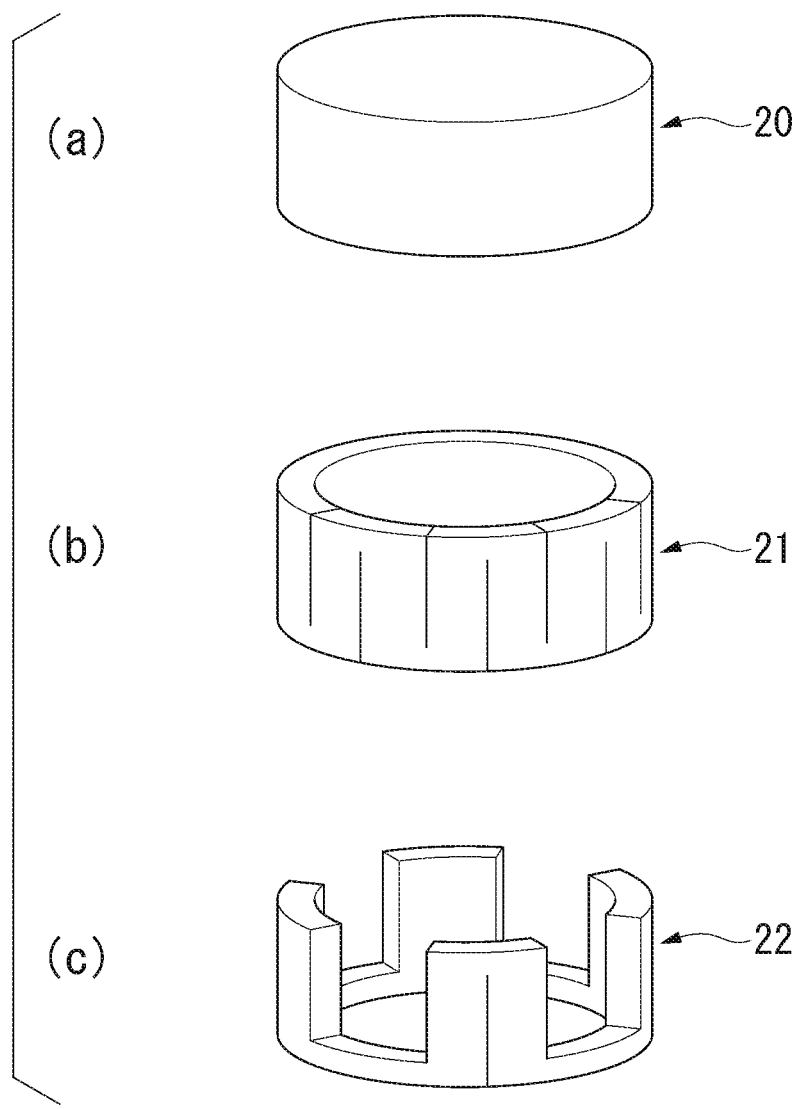
FIG. 3 is a diagram schematically showing the shape of an inner heating device.

A shape of the inner heating device 20 is not particularly limited as long as it can be housed within the recess 12a or recess 12b. It is preferable to set according to the shape of the recess 12a or recess 12b. FIG. 3 is a diagram schematically showing the shape of the inner heating device. The inner heating device 20 shown in FIG. 3 (a) can be used when the recess 12a has a circular shape in plan view (FIG. 1). The inner heating device 21 shown in FIG. 3 (b) or the inner heating device 22 shown in FIG. 3 (c) can be used when the recess 12b has an annular shape in plan view (FIG. 2).

The inner heating device 20 may further include a moving mechanism which can move the inner heating device 20 in the height direction of the crucible 10. By moving the inner heating device 20 in the height direction of the crucible 10, it is possible to intensively heat the portion where the source material G is difficult to be sublimed. The moving mechanism for moving the inner heating device 20 is not particularly limited. For example, a lift for moving the inner heating device 20 up and down in the height direction can be used.

Outer Heating Device

As the outer heating device 30, a known heating method can be used. For example, a resistance heating method, an induction heating method or the like can be used as the heating method. The outer heating device 30 shown in FIG. 1 includes a coil 31 and a heater 32 which generates heat by receiving a high frequency generated from the coil 31. The outer heating device 30 shown in FIG. 1 is a heating device using an induction heating method in which induction heating of the heater 32 is carried out by supplying an electric current to the coil 31.

The configuration of the SiC single crystal growth apparatus has been described specifically. Next, the operation of the SiC single crystal growth apparatus will be described.

Figure 4:
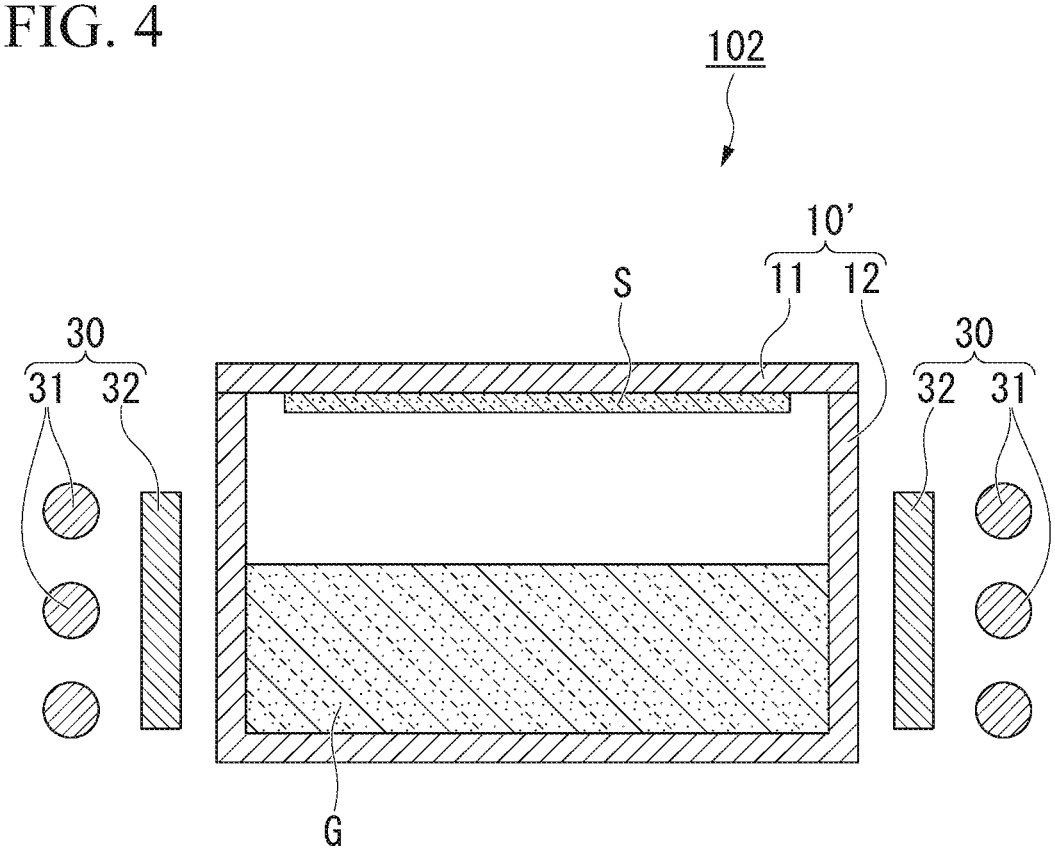
FIG. 4 is a schematic cross-sectional view of a SiC single crystal growth apparatus having no inner heating device.

FIG. 4 is a schematic cross-sectional view of a SiC single crystal growth apparatus 102 having no inner heating device. The SiC single crystal growth apparatus 102 shown in FIG. 4 is different from the SiC single crystal growth apparatus 100 shown in FIG. 1 in that the inner heating device 20 and the recess 12a for installing the inner heating device 20 are not provided. In FIG. 4, the same components as those in FIG. 1 are denoted by the same reference numerals.

A crucible 10' shown in FIG. 4 is heated by an outer heating device 30. In other words, the central portion of the crucible 10' has a relatively low temperature as compared with the outer peripheral portion. Therefore, the source material G placed in the central portion of the crucible 10' is difficult to be sublimed.

This trend becomes remarkable as the diameter of the single crystal growing on the seed crystal S increases. When the diameter of the single crystal is about 3 to 4 inches, since the diameter of the crucible 10' is not so large, even if there is a temperature difference in the crystal 10', the source material G in the central part can be sublimed. When the diameter of the single crystal is 6 inches, since the diameter of the crucible 10' is large, the central portion cannot be heated enough. That is, the source material G in the central portion is not sublimed, and the source material G cannot be efficiently utilized for growing a single crystal.

This trend becomes remarkable as the temperature necessary for subliming the source material G increases. For example, when the source material G is SiC, a temperature exceeding 2000° C. is required to sublime the source material G. Therefore, the temperature difference between the heated portion and the unheated portion becomes larger.

On the other hand, as shown in FIG. 1, the SiC single crystal growth apparatus 100 according to the present embodiment heats the crucible 10 by using the inner heating device 20 and the outer heating device 30. Since the crucible 10 is heated from the outer peripheral side and the central portion side, the temperature difference between the outer peripheral portion and the central portion of the central portion of the crucible 10 is reduced. Further, the inner heating device 20 is heated independently of the outer heating device 30. That is, heating by the inner heating device 20 is not insufficient.

As described above, according to the SiC single crystal growth apparatus 100 of the present embodiment, the central portion of the crucible 10 can also be sufficiently heated, and the source material G placed in the central portion of the crucible 10 can also be sublimed. That is, the source material G installed in the crucible 10 can be utilized efficiently without residue.

Figure 5:
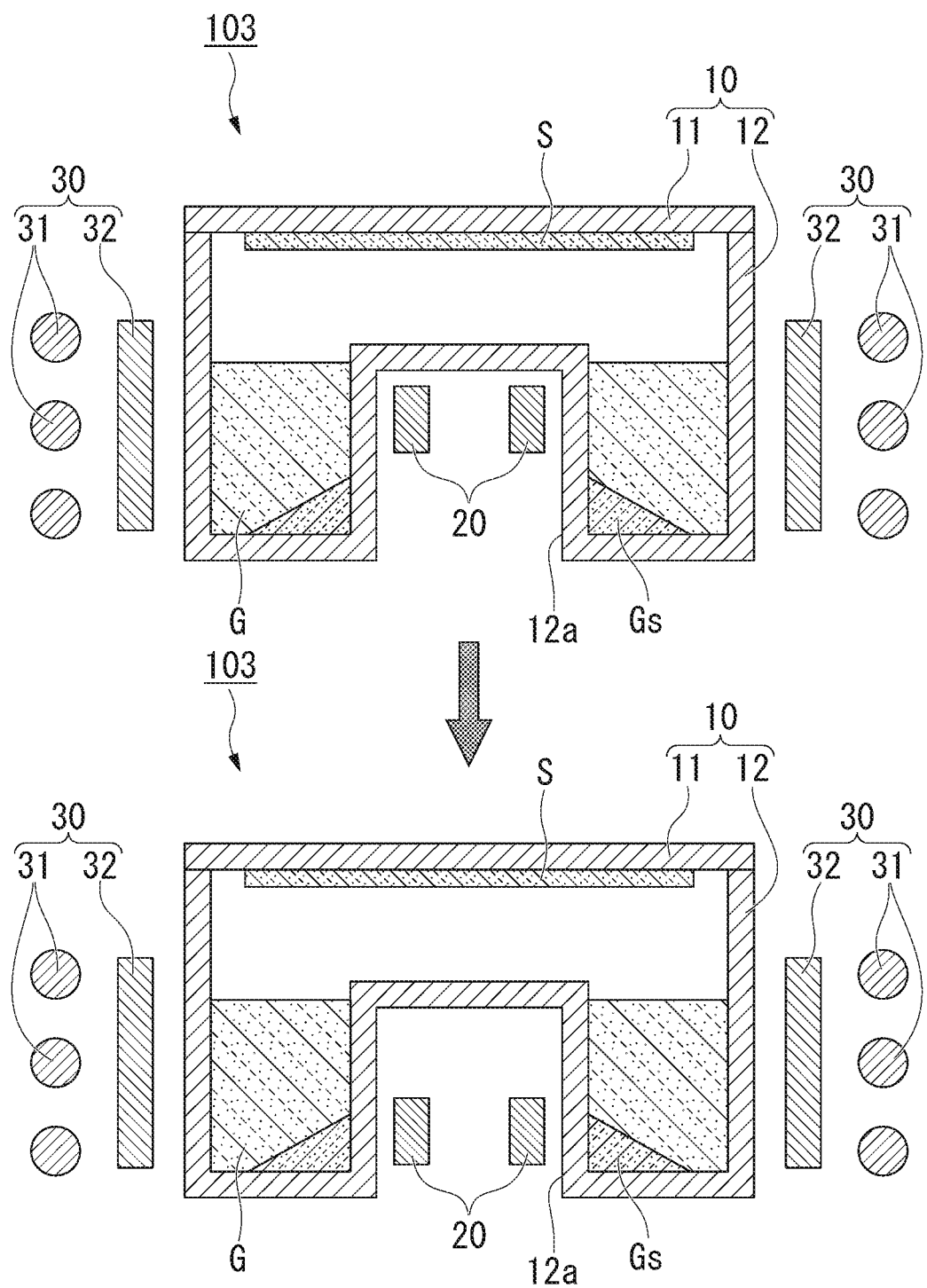
FIG. 5 is a schematic cross-sectional view of a SiC single crystal growth apparatus when the inner heating device moves in the height direction of the crucible.

FIG. 5 is a schematic cross-sectional view of the SiC single crystal growth apparatus 103 when the inner heating device 20 moves in the height direction of the crucible 10. As shown in FIG. 5, when the thickness of the inner heating device 20 in the height direction is smaller than the depth of the recess 12a, a part of the source material may be sintered in the source material G to form the source material sintered portion Gs. Even in this case, by moving the inner heating device 20 to the portion where the source material sintered part Gs is formed, the material of the source material sintered part Gs can also be effectively sublimed.

While the preferred embodiments of the present invention have been described in detail, the present invention is not limited to the specific embodiments, and various changes and modifications may be made within the present invention described in the claims can be modified/changed.

For example, in FIGS. 1, 2, and 5, the source material G is placed in a groove formed in the crucible by the recess. The source material G is not necessary placed within the groove. For example, the outermost surface of the source material G may exist at a position higher than one end of the groove wherein the end is on the lid side.

REFERENCE SIGNS LIST 10, 10': Crucible,
11: Lid,
12: Container,
12a: Bottom
12a, 12b: Recess
20, 21, 22: Inner Heating device
30: Outer Heating device
31: Coil
32: Heater 100, 101, 102, 103: SiC Single Crystal Growth Apparatus,
S: Seed Crystal,
G: Source Material

What is claimed is:

1. A SiC single crystal growth apparatus comprising a crucible and an outer heating device, the crucible comprising:
   a lid,
   a container,
      wherein the container comprises a closed bottom which faces the lid, and
      the bottom comprises an annular recess in plan view, the recess opens at the bottom of the container and extends towards the lid, and
      the recess is in a concentric position from a center of the bottom in plan view,
   the SiC single crystal growth apparatus further comprising an inner heating device provided in the recess of the crucible, and a lift configured to move the inner heating device up and down in a height direction of the crucible,
   wherein the outer heating device is provided at an outer peripheral side of the crucible, and
   wherein a thickness of the inner heating device in the height direction is smaller than a depth of the recess.

2. The SiC single crystal growth apparatus according to claim 1,
   wherein the inner heating device uses a resistance heating method.

3. The SiC single crystal growth apparatus according to claim 1,
   wherein the lid has a first surface facing the bottom, and a seed crystal is placed on the first surface.

4. The SiC single crystal growth apparatus according to claim 1,
   wherein the inner heating device uses an induction heating method.

5. The SiC single crystal growth apparatus according to claim 4,
   wherein the inner heating device has a high frequency generation source.

6. The SiC single crystal growth apparatus according to claim 5,
   wherein while a SiC single crystal is grown, the high frequency generation source is covered with a heat insulating material.

7. The SiC single crystal growth apparatus according to claim 1,
   wherein the inner heating device has an annular body in plan view and has protrusions extending from the annular body towards the lid at concentric positions from a center in plan view.

8. The SiC single crystal growth apparatus according to claim 1,
   wherein a diameter of a single crystal growing on a seed crystal is 6 inches or more, and
   in order to sublimate a raw material, the raw material is heated at a temperature exceeding 2000° C.

* * * * *